United States Patent
Ng et al.

(10) Patent No.: US 7,522,443 B2
(45) Date of Patent: Apr. 21, 2009

(54) FLAT-CELL READ-ONLY MEMORY STRUCTURE

(75) Inventors: Wai Hon Ng, Hong Kong (HK); Chi Wai Lee, Hong Kong (HK); Ka Wai Cheung, Hong Kong (HK); Yin Li, Hong Kong (HK)

(73) Assignee: Solomon Systech Limited, New Territories (HK)

( * ) Notice: Subject to any disclaimer, the term of this patent is extended or adjusted under 35 U.S.C. 154(b) by 64 days.

(21) Appl. No.: 11/181,914

(22) Filed: Jul. 15, 2005

(65) Prior Publication Data

US 2007/0014142 A1    Jan. 18, 2007

(51) Int. Cl.
*G11C 17/00* (2006.01)
(52) U.S. Cl. .......................... 365/94; 365/104; 365/191
(58) Field of Classification Search .................. 365/94, 365/104, 191, 198, 63
See application file for complete search history.

(56) References Cited

U.S. PATENT DOCUMENTS

| | | | |
|---|---|---|---|
| 5,117,389 A | 5/1992 | Yiu | |
| 5,621,697 A | 4/1997 | Weng et al. | |
| 5,825,683 A * | 10/1998 | Chang | ........................ 365/104 |
| 5,943,286 A * | 8/1999 | Orita | ..................... 365/230.03 |
| 6,084,794 A | 7/2000 | Lu et al. | |
| 6,278,649 B1 | 8/2001 | Lee et al. | |
| 6,430,079 B1 | 8/2002 | Shiau | |
| 6,653,692 B2 * | 11/2003 | Kao | ........................... 257/390 |

* cited by examiner

*Primary Examiner*—Hoai V Ho
*Assistant Examiner*—Kretelia Graham
(74) *Attorney, Agent, or Firm*—Finnegan, Henderson, Farabow, Garrett & Dunner LLP

(57) ABSTRACT

The integrated circuit memory comprises a memory array including a plurality of memory cells in rows and columns, the memory array being divided into a plurality of blocks of the memory cells. Each of the blocks includes a plurality of word lines arranged along the rows and coupled to the memory cells, a plurality of first and second bit lines alternately allocated along every other column, a first selecting line for providing a control signal, a second selecting line for providing the control signal, a plurality of first selecting transistors having their gates coupled to the first selecting line to receive the control signal, each of the first selecting transistors for coupling one of the memory cells in a selected row to one of the first bit lines in response to the control signal, two of the first selecting transistors being coupled to a same one of the first bit lines and located on opposite sides of the one of the first bit lines, and a plurality of second selecting transistors having their gates coupled to the second selecting line to receive the control signal, each of the second selecting transistors coupled to one of the second bit lines, each of the second selecting transistors for coupling one of the memory cells in the selected row to one of the second bit lines in response to the control signal.

7 Claims, 15 Drawing Sheets

FLAT-CELL READ-ONLY MEMORY STRUCTURE

FIELD OF THE INVENTION

The present invention generally relates to a read-only memory (ROM) and, more particularly, to a flat-cell ROM structure.

BACKGROUND OF THE INVENTION

Several ROM structures are well known in the art. One common ROM structure is referred to as a flat-cell ROM. The flat-cell ROM occupies a very small area per memory cell compared to other known ROM structures, which is an advantage of the flat-cell ROM structure.

FIGS. 1A and 1B are diagrams illustrating a typical flat-cell ROM array 10. FIG. 1A is a diagrammatic plan view of flat-cell ROM array 10. FIG. 1B illustrates a cross-sectional view of flat-cell ROM array 10 of FIG. 1A along a line 1B-1B. With reference to FIGS. 1A and 1B, horizontal lines 100, 102, and 104 are polysilicon word lines, and vertical lines 106, 108, and 110 are BN+ (buried N+) bit lines. Bit lines 106, 108, and 110 are deposited in a silicon substrate 112. A thin gate oxide 114 is deposited over silicon substrate 112 to form an insulation layer and word line 102 is deposited over thin gate oxide 114. Each cell of flat-cell ROM array 10 includes a field effect transistor (FET), such as transistors M0~M5 shown in FIG. 1A, formed between two adjacent bit lines under one of the word lines, to store a bit of data. For example, with reference to FIG. 1B, word line 102 forms a gate (G) of transistors M1 and M4. BN+ bit lines 106 and 108 form respective source and drain (S/D) of transistor M1 and BN+ bit lines 108 and 110 form a source and a drain (S/D), respectively, of transistor M4. Each FET can be either N-type or P-type.

FIG. 2 is a diagram illustrating a cell 200 of flat-cell ROM array 10 and a typical accessing circuit for accessing cell 200. Cell 200 of flat-cell ROM array 10 includes a field effect transistor 201. A word line 202 forms a gate of transistor 201. A source (S) of transistor 201 corresponds to a bit line 204 and is coupled to a virtual ground voltage Vss. A drain (D) of transistor 201 corresponds to a bit line 206 and is selectively coupled to either a sense amplifier 208 or a pre-charge circuit 210 by a switch 212. Cp is a parasitic capacitance of bit line 206 and Vbit is the voltage of bit line 206.

FIGS. 3A, 3B, and 3C are diagrams illustrating an example of the operation of the typical accessing circuit shown in FIG. 2 and transistors within memory cells. Transistor 201 is processed to have either a high (e.g. 3.3V) or a low (e.g., 0.7V) threshold voltage (Vth) for representing binary data. With reference to FIG. 3A, before reading data, word line 202 does not apply a gate voltage to the gate of transistor 201 and the drain of transistor 201 is coupled to pre-charge circuit 210. In this condition, transistor 201 is OFF while the parasitic capacitance Cp is pre-charged by pre-charge circuit 210 to a fixed voltage Vpre_c. After the parasitic capacitance Cp is pre-charged to the fixed voltage Vpre_c, a reading stage is commenced in which a gate voltage, e.g., 3V, is applied to the gate of transistor 201 by word line 202 and bit line 206 is coupled to sense amplifier 208. FIG. 3B illustrates the reading stage for the case when transistor 201 is processed to have a high Vth. Since the applied gate voltage is below the high Vth, transistor 201 will remain OFF and the voltage of bit line 206 will remain at Vpre_c. In this condition, sense amplifier 208, which is coupled to bit line 206, will output a high voltage signal representing binary data "1". FIG. 3C illustrates the reading stage for the case when transistor 201 is processed to have a low Vth. Since the applied gate voltage is above the low Vth, transistor 201 is turned ON. In this condition, the voltage of bit line 206 will be discharged to virtual ground voltage Vss as the source of transistor 201 is coupled to virtual ground voltage Vss. The sense amplifier 208, which is coupled to bit line 206, will output a low voltage signal representing binary data "0".

FIG. 4 is a diagram illustrating typical flat-cell ROM array 10 on which a path of current flow is an accessing path and is indicated by a broken line. When data is read from a specific cell 224 during the reading stage, a current flow follows a path from sense amplifier 208 to virtual ground voltage Vss through cell 224 and the accessing circuit. For example, with reference to FIG. 4, if transistor M1 of cell 224 has a low Vth, during the reading stage, transistor M1 of cell 224 is ON. As a result, a current flows from sense amplifier 208 to virtual ground voltage Vss through a transistor 220 coupled to sense amplifier 208, transistor M1 of cell 224, and a transistor 222 coupled to virtual ground voltage Vss. If transistor M1 of cell 224 has a high Vth, during the reading stage, transistor M1 of cell 224 is OFF, the accessing path is open, and current does not flow.

The time required to access any cell of flat-cell ROM array 10 is determined by the capacitance of the parasitic capacitor Cp and the resistance of the accessing path. For a given capacitance of the parasitic capacitor Cp, the minimum access time is limited by the resistance of the access path, which depends upon a length (L) of the accessing path and the number of transistors in the accessing path. With reference to FIG. 4, since at least two transistors are needed by a flat-cell ROM array 10 to couple to sense amplifier 208 and virtual ground voltage Vss, the minimum number of transistors of the accessing circuit in the accessing path is two.

FIG. 5 is a diagram illustrating an example of a conventional flat-cell ROM structure. In order to reduce the series resistance of the accessing path and parasitic capacitance, the flat-cell ROM array is divided into several blocks. An example of such a conventional flat-cell ROM structure is shown in FIG. 3 of U.S. Pat. No. 6,084,794 entitled "HIGH SPEED FLAT-CELL MASK ROM STRUCTURE WITH SELECT LINES" of Lu et al., which is reproduced as FIG. 5 herein. With reference to FIG. 5, BLs and WLs are bit lines and word lines, respectively, and BSs, such as $BS_j$, are block selecting lines for applying block selecting signals to control block selecting transistors, such as B0~B3. There are two cells, which are referred to as even and odd cells, located between every two adjacent bit lines under the same word line. For example, cells C00 and C01, which are referred to as even and odd cells, respectively, are located between two adjacent bit lines $BL_{i-1}$ and $BL_i$ under word line WL0. ESs and OSs are even and odd selecting lines for providing even and odd selecting signals to control even selecting transistors Ei and odd selecting transistors Oi, respectively. $ES_i$ is an even selecting line for providing even selecting signals to control even selecting transistors E1, E2, and E3, and $OS_i$ is an odd selecting line for providing odd selecting signals to control odd selecting transistors O1, O2, O3, and O4. For example, if an even cell C10 of a $block_j$ is to be read, block selecting line $BS_j$ is pulled high to turn ON the corresponding block selecting transistors B0~B3 of the $block_j$ and an even selecting line $ES_i$ is also pulled high to turn ON the corresponding even selecting transistors E1~E3 of the blocks. Meanwhile, odd selecting line $OS_i$ is pulled low so that the corresponding odd selecting transistors O1~O4 of the $block_j$ remain OFF. Two adjacent bit lines $BL_{i-1}$ and $BL_i$ are coupled to virtual ground voltage Vss and a sense amplifier (not shown), respectively, and another bit line $BL_{i+1}$ is coupled to a reference voltage VBL, which is at substantially the same voltage level as the sense amplifier. The remaining bit lines are left floating. In this manner, a current flows from the sense amplifier through the even selecting transistor E1, the even cell C10, and the block selecting transistor B0 to virtual ground voltage Vss. In this design, the number of transistors of the accessing circuit in the accessing path is two, i.e., the even selecting transistor E1 and the block selecting transistor B0. As a result, in order to implement this conventional flat-cell ROM structure, multiple control signals, i.e., the block selecting signals, the odd selecting signals, and the even selecting signals, are required to control the operation of the conventional flat-cell ROM shown in FIG. 5 during the reading stage. Also, it is necessary to provide an area within an integrated circuit for a circuit to generate and provide these control signals.

FIG. 6 is a diagram illustrating another example of a conventional flat-cell ROM structure. This example of such a conventional flat-cell ROM structure is shown in FIG. 2 of U.S. Pat. No. 6,430,079 entitled "FLAT MEMORY CELL READ ONLY MEMORY" of Shiau, which is reproduced as FIG. 6 herein. With reference to FIG. 6, four control lines BS1, BS2, BS3, and BS4 for providing four control signals are required for each block of the ROM structure. For example, if a cell C10 of block i is to be read, control lines BS1i and BS3i are pulled high, while control lines BS2i and BS4i are pulled low. Bit Lines BL0 and BL1 are coupled to virtual ground voltage Vss and a sense amplifier (not shown), respectively. A current flows from the sense amplifier through a selecting transistor D1, the transistor of cell C10, and a selecting transistor A1 to virtual ground voltage Vss. If a cell C11 of block i is to be read, control lines BS1i and BS4i are pulled low, while control lines BS2i and BS3i are pulled high. A current flows from the sense amplifier through the selecting transistor D1, the transistor of cell C11, and a selecting transistor B1 to virtual ground voltage Vss. If a cell C12 of block i is to be read, control lines BS1i and BS3i are pulled low, while control lines BS2i and BS4i are pulled high. If a cell C13 of block i is to be read, control lines BS2i and BS3i are pulled low, while control lines BS1i and BS4i are pulled high. As a result, in order to implement this conventional flat-cell ROM structure, each block of the conventional flat-cell ROM structure requires four individual control signals to cooperatively control the operation of the conventional flat-cell ROM shown in FIG. 6. Also, a circuit to generate and provide these control signals is needed.

FIG. 7 is a diagram illustrating still another example of the conventional flat-cell ROM structure. This example of such a conventional flat-cell ROM structure is shown in FIG. 4 of U.S. Pat. No. 5,117,389 entitled "FLAT-CELL READ-ONLY-MEMORY INTEGRATED CIRCUIT" of Yiu, which is reproduced as FIG. 7 herein. With reference to FIG. 7, in addition to bit lines ($VG_N$, $VG_{N+1}$, $VG_{N+2}$, $BL_N$, and $BL_{N+1}$) and word lines ($SWL_{N,1}$~$SWL_{N,M}$), the flat-cell ROM structure of FIG. 7 includes block selecting lines (BWL) coupled to block selecting transistors, bank left selecting lines (SBL) coupled to bank left selecting transistors L1~L10, and bank right selecting lines (SBR) coupled to bank right selecting transistors R1~R10. In this structure, three types of control signals, i.e., block selecting signals, bank left selecting signals, and bank right selecting signals, are required to control the operation of each block of the conventional flat-cell ROM structure of FIG. 7.

If the number of required control signals is increased, the area required by the circuit to generate and provide these control signals also increases. Therefore, it is desirable to minimize the number of the control signals to reduce the overall size of the flat-cell ROM. Besides the flat-cell ROM structures shown in FIGS. 5, 6, and 7, there are a number of other conventional flat-cell ROM structures. Some examples of them are shown in U.S. Pat. Nos. 5,621,697, 5,825,683, 6,278,649, and 6,653,692. Among these conventional flat-cell ROM structures, the minimum number of required control signals to control the operation of each block of these conventional flat-cell ROM structures is three.

Referring again to FIG. 7, the length of the accessing path in the illustrated conventional flat-cell ROM structure will be different when different cells are read. Two paths are superimposed on FIG. 7 and are the accessing paths through which current flows from a sense amplifier (not shown) to virtual ground voltage Vss when a cell 101-2 coupled to word line $SWL_{N,1}$ and a cell coupled to word line $SWL_{N,M}$ are accessed. Since the length of the accessing path determines the resistance of the accessing path, the time required to access the cell of the flat-cell ROM array shown in FIG. 7 varies from position to position depending on the location of the cell, which is due to the variable resistance of the accessing paths.

There is thus a general need in the art for flat-cell ROM structure which employs the smallest number of required control signals to control each block of the flat-cell ROM array. Moreover, the length of the accessing path to access any cell of the flat-cell ROM array is constant.

SUMMARY OF THE INVENTION

Accordingly, the present invention is directed to flat-cell ROM structure that obviates one or more of the problems due to limitations and disadvantages of the related art.

In accordance with the present invention, there is provided an integrated circuit memory. The integrated circuit memory comprises a memory array including a plurality of memory cells in rows and columns, the memory array being divided into a plurality of blocks of the memory cells. Each of the blocks includes a plurality of word lines arranged along the rows and coupled to the memory cells, a plurality of first and second bit lines alternately allocated along every other column, a first selecting line for providing a control signal, a second selecting line for providing the control signal, a plurality of first selecting transistors having their gates coupled to the first selecting line to receive the control signal, each of the first selecting transistors for coupling one of the memory cells in a selected row to one of the first bit lines in response to the control signal, two of the first selecting transistors being coupled to a same one of the first bit lines and located on opposite sides of the one of the first bit lines, and a plurality of second selecting transistors having their gates coupled to the second selecting line to receive the control signal, each of the second selecting transistors coupled to one of the second bit lines, each of the second selecting transistors for coupling one of the memory cells in the selected row to one of the second bit lines in response to the control signal.

Also in accordance with the present invention, there is provided an integrated circuit memory. The integrated circuit memory comprises a memory array including a plurality of memory cells in rows and columns, the memory array being divided into a plurality of blocks of the memory cells. Each of the blocks includes a plurality of word lines arranged along the rows and coupled to the memory cells, a plurality of first and second bit lines alternately allocated along every other column, each of the first bit lines for coupling to a virtual ground voltage, each of the second bit lines for coupling to a sense amplifier, a first selecting line for providing a first control signal, a second selecting line for providing the first control signal, a third selecting line for providing a second control signal, a fourth selecting line for providing the second control signal, a plurality of first selecting transistors having their gates coupled to the first selecting line to receive the first control signal, each of the first selecting transistors for coupling one of the memory cells in a selected row to one of the first bit lines in response to the first control signal, two of the first selecting transistors being coupled to a same one of the first bit lines and located on opposite sides of the one of the first bit lines, a plurality of second selecting transistors having their gates coupled to the third selecting line to receive the second control signal, each of the second selecting transistors for coupling one of the memory cells in the selected row to one of the second bit lines in response to the second control signal, two of the second selecting transistors being coupled to a same one of the second bit lines and located on opposite sides of the one of the second bit lines, a plurality of third selecting transistors having their gates coupled to the second selecting line to receive the first control signal, each of the third selecting transistors coupled to one of the second bit lines, each of the third selecting transistors for coupling one of the memory cells in the selected row to one of the second bit lines in response to the first control signal, and a plurality of fourth selecting transistors having their gates coupled to the fourth selecting line to receive the second control signal, each of the fourth selecting transistors coupled to one of the first bit lines, each of the fourth selecting transistors for coupling one of the memory cells in the selected row to one of the first bit lines in response to the second control signal.

Further in accordance with the present invention, there is provided a method for reading out data from a flat cell read-only memory comprising a memory array including a plurality of memory cells in rows and columns, the memory array being divided into a plurality of blocks of the memory cells. Each block includes a plurality of word lines arranged along the rows and coupled to the memory cells, a plurality of first and second bit lines alternately allocated along every other column, each of the first bit lines for coupling to a virtual ground voltage and each of the second bit lines for coupling to a sense amplifier, a first selecting line for providing a control signal, a second selecting line for providing the control signal, a plurality of first selecting transistors having their gates coupled to the first selecting line to receive the control signal, each of the first selecting transistors for coupling one of the memory cells in a selected row to one of the first bit lines in response to the control signal, two of the first selecting transistors being coupled to a same one of the first bit lines and located on opposite sides of the one of the first bit lines, and a plurality of second selecting transistors having their gates coupled to the second selecting line to receive the control signal, each of the second selecting transistors coupled to one of the second bit lines, each of the second selecting transistors for coupling one of the memory cells in the selected row to one of the second bit lines in response to the control signal. The method comprises enabling one of the word lines, coupling one of the first bit lines to the virtual ground voltage, coupling one of the second bit lines to the sense amplifier, and applying the control signal to the first selecting line and the second selecting line to turn ON the first and the second selecting transistors. By applying the control signal, one of the memory cells coupled to the enabled word line of one of the blocks is selected to be coupled to one of the first bit lines coupled to the virtual ground voltage by one of the first selecting transistors and one of the second bit lines coupled to the sense amplifier by one of the second selecting transistors.

Additionally in accordance with the present invention, there is provided a method for reading out data from a flat cell read-only memory comprising a memory array including a plurality of memory cells in rows and columns. The memory array is divided into a plurality of blocks of the memory cells. Each of the blocks includes a plurality of word lines arranged along the rows and coupled to the memory cells, a plurality of first and second bit lines alternately allocated along every other column, each of the first bit lines for coupling to a sense amplifier and each of the second bit lines for coupling to a virtual ground voltage, a first selecting line for providing a control signal, a second selecting line for providing the control signal, a plurality of first selecting transistors having their gates coupled to the first selecting line to receive the control signal, each of the first selecting transistors for coupling one of the memory cells in a selected row to one of the first bit lines in response to the control signal, two of the first selecting transistors being coupled to a same one of the first bit lines and located on opposite sides of the one of the first bit lines, and a plurality of second selecting transistors having their gates coupled to the second selecting line to receive the control signal, each of the second selecting transistors coupled to one of the second bit lines, each of the second selecting transistors for coupling one of the memory cells in the selected row to one of the second bit lines in response to the control signal. The method comprises enabling one of the word lines, coupling one of the first bit lines to the sense amplifier, coupling one of the second bit lines to the virtual ground voltage, and applying the control signal to the first selecting line and the second selecting line to turn ON the first and the second selecting transistors. By applying the control signal, one of the memory cells coupled to the enabled word line of one of the blocks is selected to be coupled to one of the first bit lines coupled to the sense amplifier by one of the first selecting transistors and one of the second bit lines coupled to the virtual ground voltage by one of the second selecting transistors.

Additionally in accordance with the present invention, there is provided a method for reading out data from a flat cell read-only memory comprising a memory array including a plurality of memory cells in rows and columns. The memory array is divided into a plurality of blocks of the memory cells. Each of the blocks includes a plurality of word lines arranged along the rows and coupled to the memory cells, a plurality of first and second bit lines alternately allocated along every other column, each of the first bit lines for coupling to a virtual ground voltage, each of the second bit lines for coupling to a sense amplifier, a first selecting line for providing a first control signal, a second selecting line for providing the first control signal, a third selecting line for providing a second control signal, a fourth selecting line for providing the second control signal, a plurality of first selecting transistors having their gates coupled to the first selecting line to receive the first control signal, each of the first selecting transistors for coupling one of the memory cells in a selected row to one of the first bit lines in response to the first control signal, two of the first selecting transistors being coupled to a same one of the first bit lines and located on opposite sides of the one of the first bit lines, a plurality of second selecting transistors having their gates coupled to the third selecting line to receive the second control signal, each of the second selecting transistors for coupling one of the memory cells in the selected row to one of the second bit lines in response to the second control signal, two of the second selecting transistors being coupled to a same one of the second bit lines and located on opposite sides of the one of the second bit lines, a plurality of third selecting transistors having their gates coupled to the second selecting line to receive the first control signal, each of the third selecting transistors coupled to one of the second bit lines, each of the third selecting transistors for coupling one of the memory cells in the selected row to one of the second bit lines in response to the first control signal, and a plurality of fourth selecting transistors having their gates coupled to the fourth selecting line to receive the second control signal, each of the fourth selecting transistors coupled to one of the first bit lines, each of the fourth selecting transistors for coupling one of the memory cells in the selected row to one of the first bit lines in response to the second control signal. The method comprises enabling one of the word lines, coupling one of the first bit lines to the sense amplifier, coupling one of the second bit lines to the virtual ground voltage, and applying either the first control signal to the first and the second selecting lines to turn ON the first and the third selecting transistors, respectively, or the second control signal to the third and the fourth selecting lines to turn ON the second and the fourth selecting transistors, respectively. By applying either the first or the second control signal, one of the memory cells coupled to the enabled word line of one of the blocks is selected to be coupled to one of the first bit lines coupled to the sense amplifier by one of the second and the third selecting transistors and coupled to one of the second bit lines coupled to the virtual ground voltage by one of the first and the fourth selecting transistors.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and, together with the description, serve to explain the principles of the invention.

DESCRIPTION OF THE EMBODIMENTS

Reference will now be made in detail to embodiments of the invention, which are illustrated in the accompanying drawings. Wherever possible, the same reference numbers will be used throughout the drawings to refer to the same or like parts.

Figure 1A:
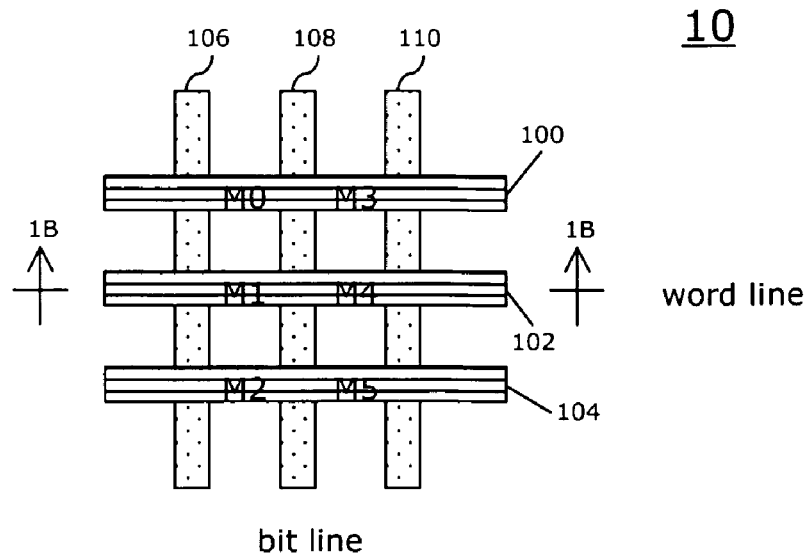
FIGS. 1A and 1B are diagrams illustrating a typical flat-cell ROM array.
Figure 1B:
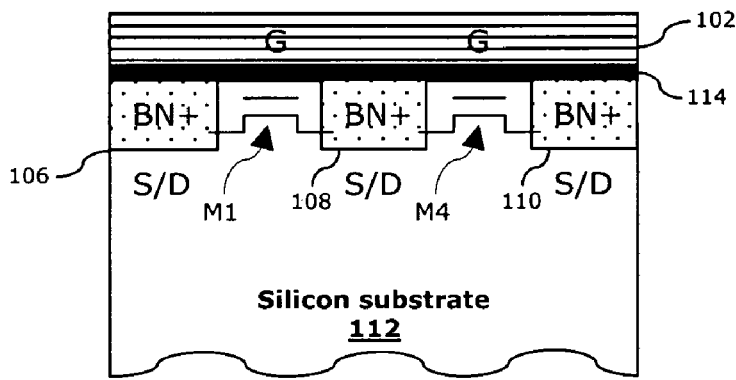
Figure 2:
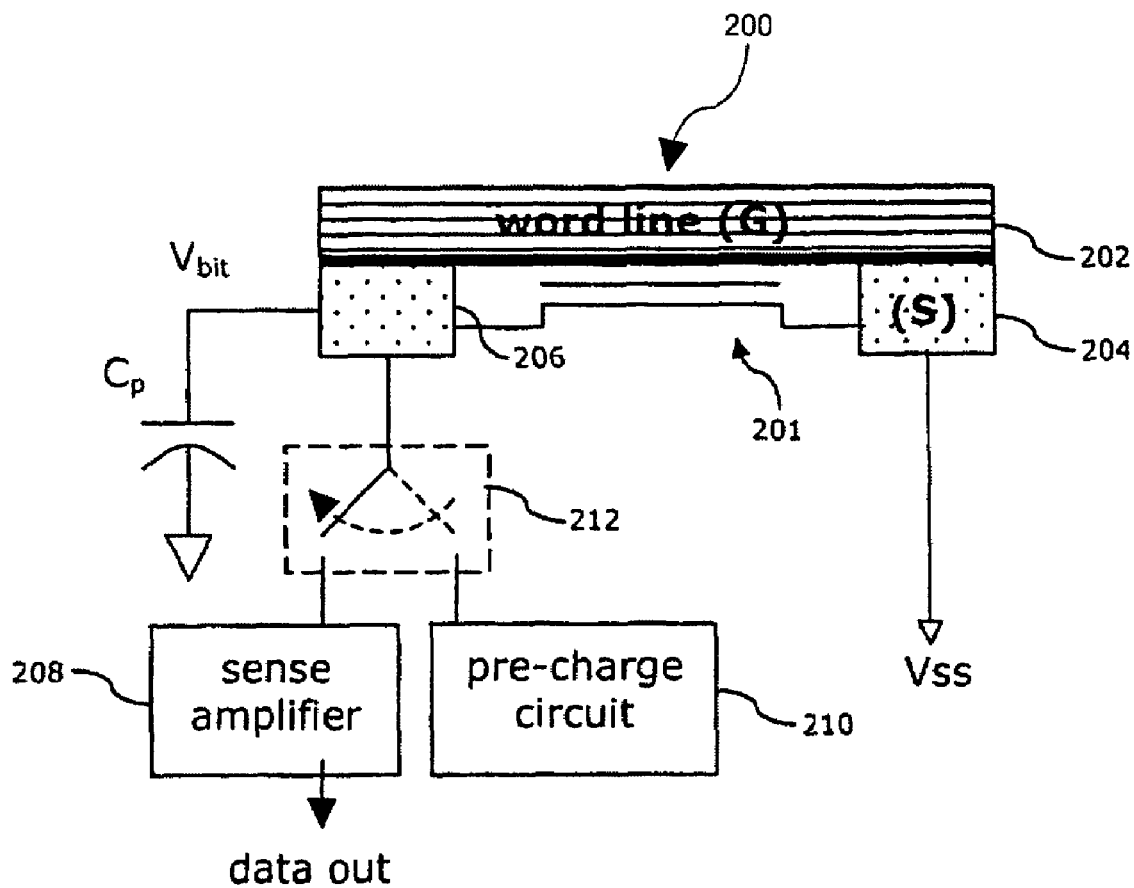
FIG. 2 is a diagram illustrating a cell and a typical accessing circuit for accessing the cell.
Figure 3A:
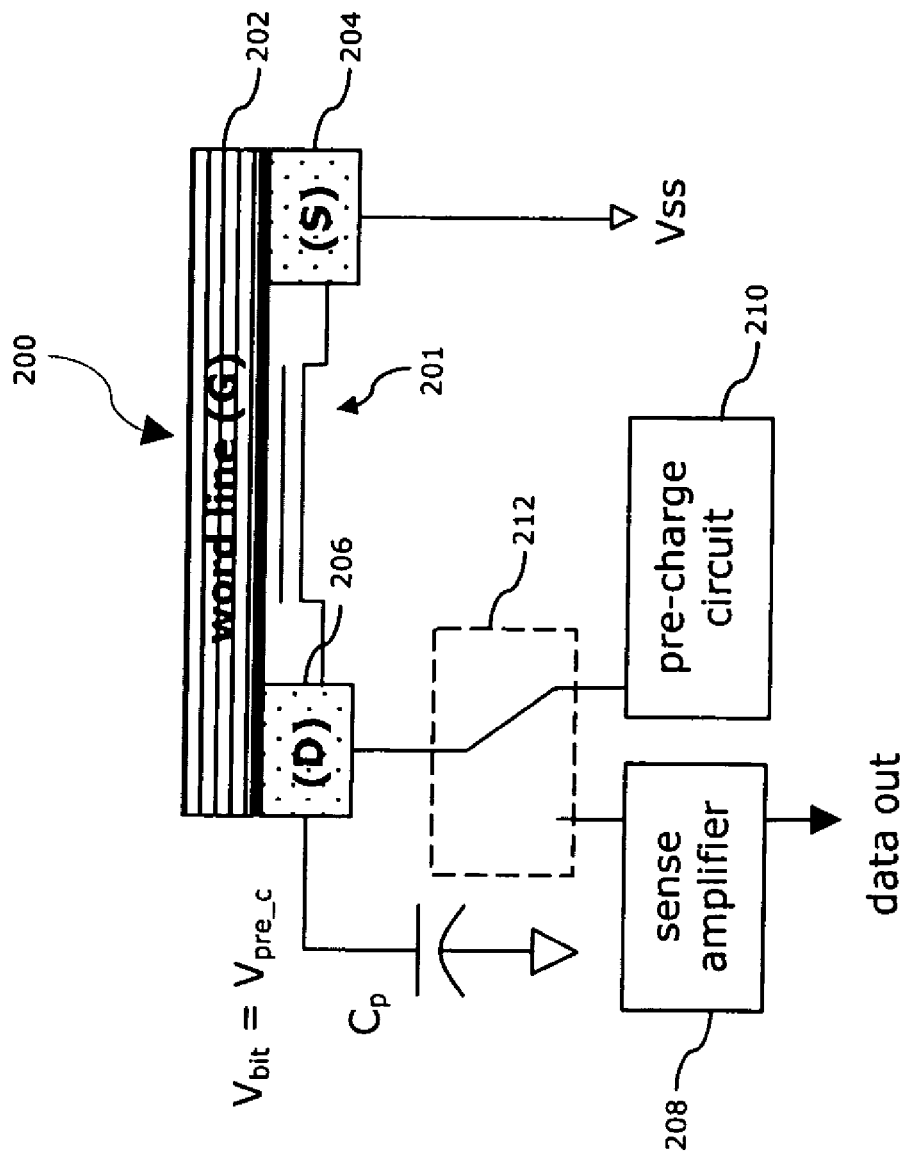
FIGS. 3A, 3B, and 3C are diagrams illustrating an example of the operation of the typical accessing circuit and transistors within memory cells.
Figures 3B, 3C:
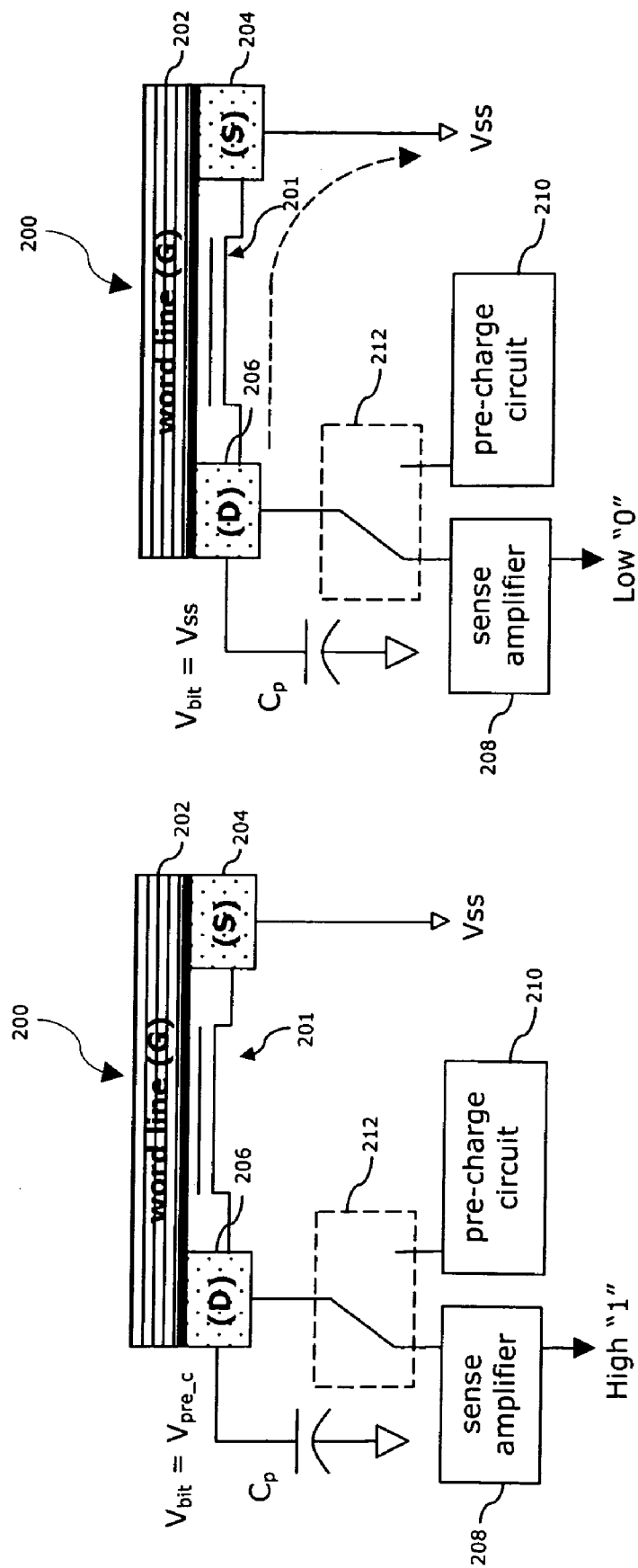
Figure 4:
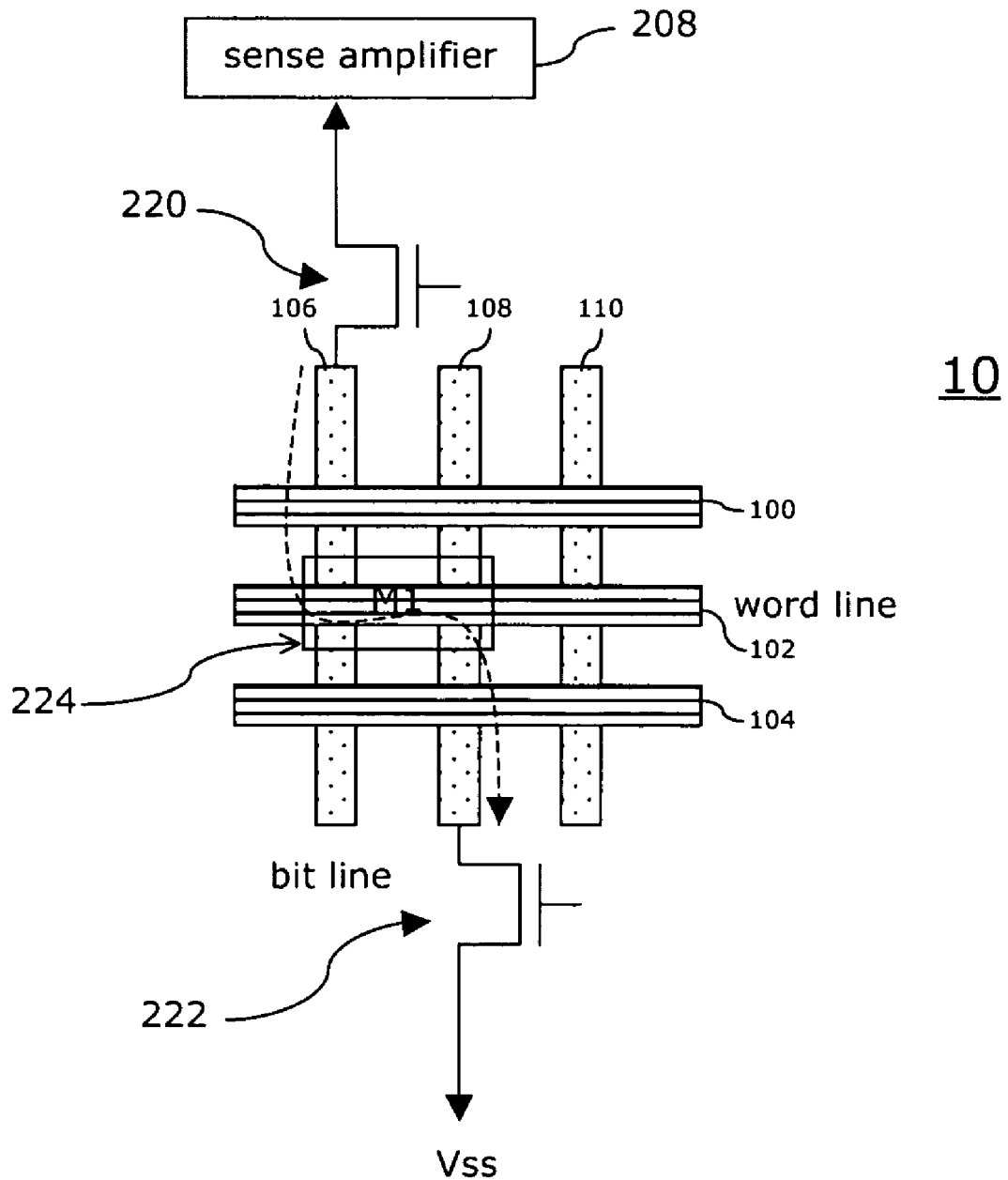
FIG. 4 is a diagram illustrating the typical flat-cell ROM array on which an accessing path is indicated.
Figure 5:
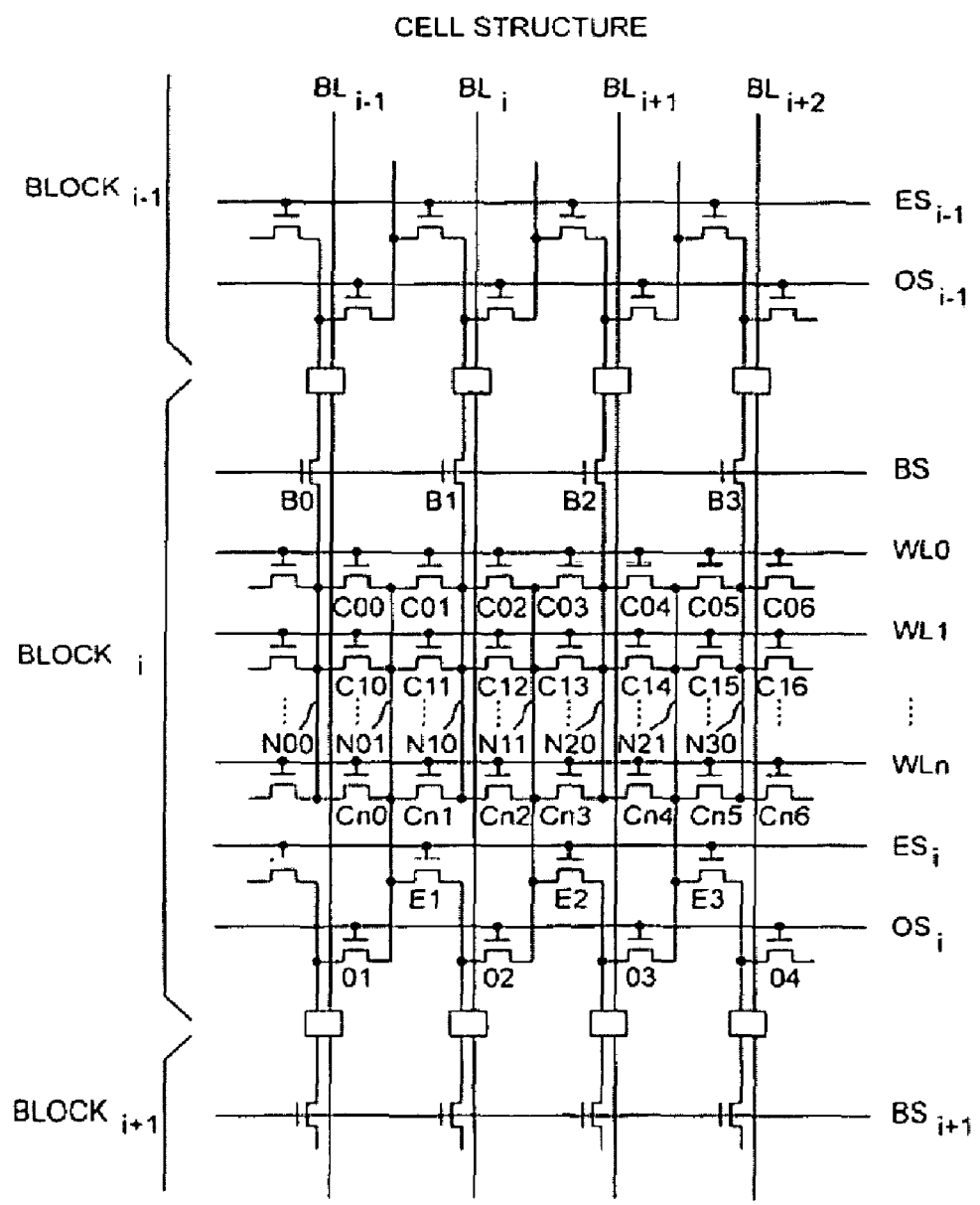
FIG. 5 is a diagram illustrating an example of a conventional flat-cell ROM structure.
Figure 6:
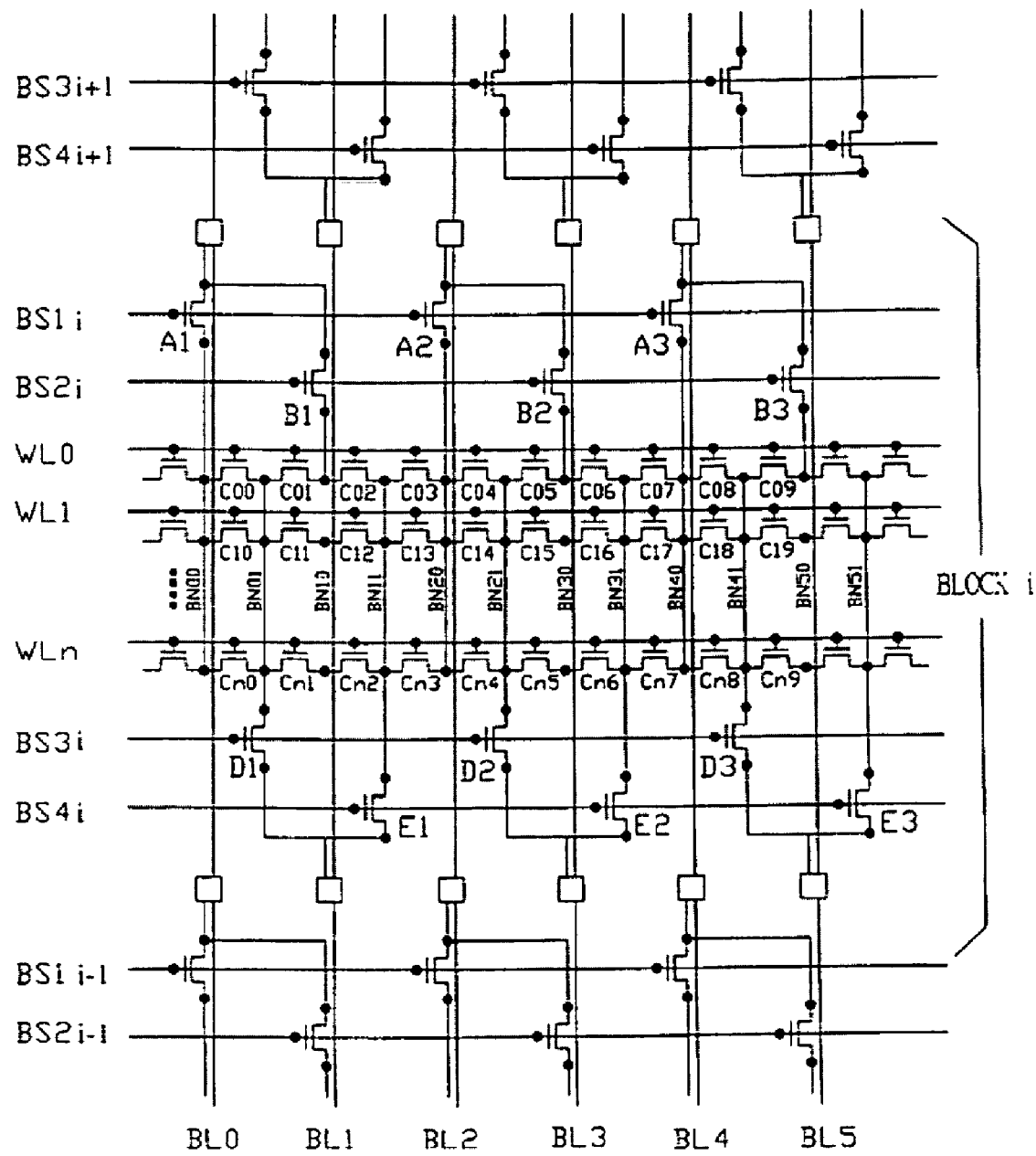
FIG. 6 is a diagram illustrating another example of a conventional flat-cell ROM structure.
Figure 7:
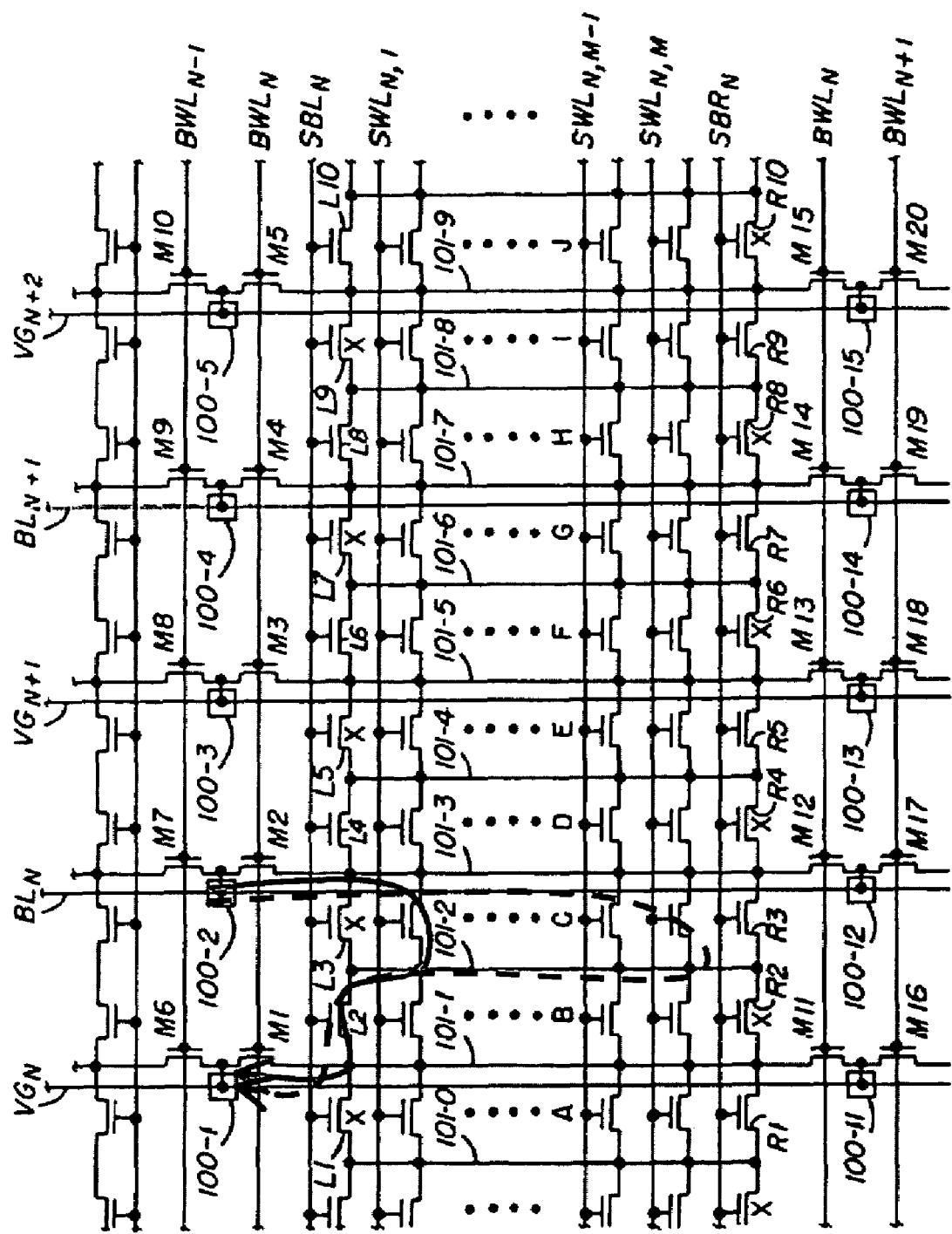
FIG. 7 is a diagram illustrating still another example of a conventional flat-cell ROM structure.
Figure 8:
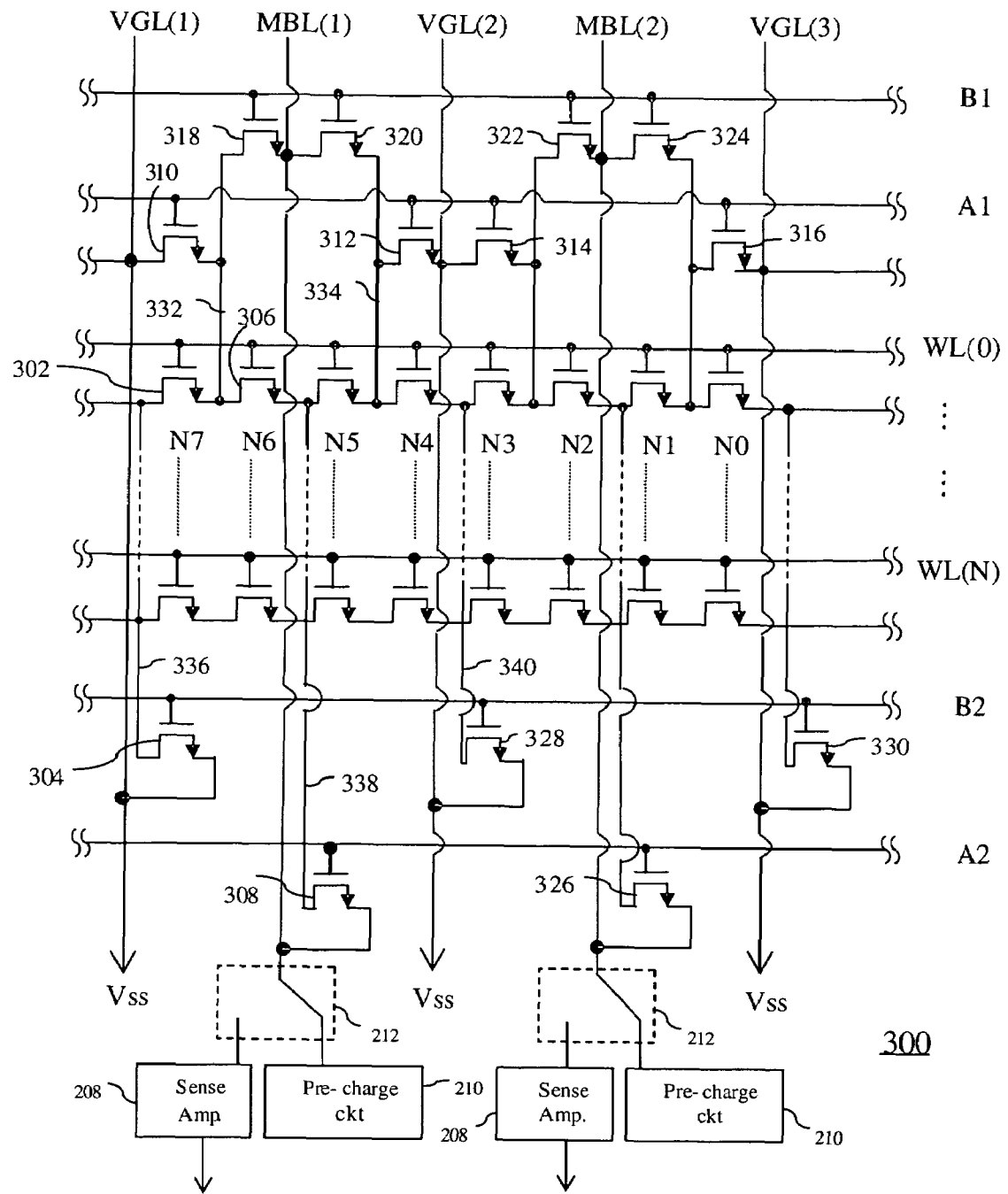
FIG. 8 is a diagram illustrating a block of a flat-cell ROM array according to an embodiment of the present invention.

FIG. 8 is a diagram illustrating a block 300 of memory cells of a flat-cell ROM array according to an embodiment of the present invention. Block 300 of the flat-cell ROM array of the illustrated embodiment includes a plurality of memory cells each comprising a transistor. Horizontal lines WL(0)~WL(N) are word lines. Vertical lines extending from the top to the bottom of FIG. 8 are bit lines. Every other bit line is designated VGL and beginning with VGL(1) is coupled to virtual ground voltage Vss. Bit lines between the VGL bit lines are designated MBLs and beginning with MBL(1) are selectively coupled to either a sense amplifier 208 or a pre-charge circuit 210 by a switch 212. During operation, only one pair of VGL and MBL are coupled to virtual ground voltage Vss and sense amplifier 208, respectively, at any given time.

Block 300 of the flat-cell ROM array includes a plurality of cells arranged in rows and columns. Every two cells connected along the same word line are located between one pair of VGL and MBL. For example, cells N0~N7 are connected to word line WL(0). Cells N7 and N6 are located between VGL(1) and MBL(1) and cells N5 and N4 are located between MBL(1) and VGL(2).

Two pairs of selecting lines A1 and B1, and A2 and B2, which are parallel to the word lines, are coupled to the gates of a plurality of selecting transistors. With reference to FIG. 8, in block 300, selecting line A1 is coupled to the gates of first selecting transistors 310, 312, 314, and 316. One pair of the first selecting transistors are coupled to one of VGLs and located on opposite sides of the coupled VGL. For example, the pair of first selecting transistors 312 and 314 are coupled to VGL(2) and located on opposite sides of VGL(2). Selecting line B1 is coupled to the gates of second selecting transistors 318, 320, 322, and 324. Pairs of the second selecting transistors are coupled to different ones of the MBLs and located on opposite sides of the coupled MBL. For example, second selecting transistors 318 and 320 are both coupled to MBL(1) and located on opposite sides of MBL(1).

For every two cells located between one of the VGLs and one of the MBLs adjacent to the VGL, there are a first selecting transistor and a second selecting transistor coupled to these two cells via a common signal line which is parallel with the bit lines. For example, for cells N7 and N6 located between VGL(1) and MBL(1), first selecting transistor 310 and second selecting transistor 318 are both coupled to a source of cell N7 and a drain of cell N6 via a common signal line 332. For cells N5 and N4 located between MBL(1) and VGL(2), first selecting transistor 312 and second selecting transistor 320 are both coupled to a source of cell N5 and a drain of cell N4 via a common signal line 334.

Selecting line A2 is coupled to the gates of third selecting transistors 308 and 326. Each of the third selecting transistors is coupled to one of the MBLs. For example, third selecting transistor 308 is coupled to MBL(1). Selecting line B2 is coupled to the gates of fourth selecting transistors 304, 328, and 330. Each of the fourth selecting transistors is coupled to one of the VGLs. For example, fourth selecting transistor 304 is coupled to VGL(1).

For every two cells located between one of the VGLs and one of the MBLs adjacent to the VGL, there is a third selecting transistor coupled to one of these two cells via a signal line parallel with the bit lines and a fourth selecting transistor coupled to another one of these two cells via another signal line parallel with the bit lines. For example, for cells N7 and N6 located between VGL(1) and MBL(1), fourth selecting transistor 304 is coupled to a drain of cell N7 via a signal line 336 and third selecting transistor 308 is coupled to a source of cell N6 via signal line 338. For cells N5 and N4 located between MBL(1) and VGL(2), fourth selecting transistor 328 is coupled to a source of cell N4 via a signal line 340 and third selecting transistor 308 is coupled to a source of cell N4 via a signal line 342 and third selecting transistor 308 is coupled to a drain of cell N5 via a signal line 338.

Each of the first and third selecting transistors is selectively turned ON/OFF by applying first control signals to its gate via selecting lines A1 and A2, respectively. Each of the second and fourth selecting transistors is selectively turned ON/OFF by applying second control signals to its gate via selecting lines B1 and B2, respectively. Data can be read out from selected cells to sense amplifier 208 through the corresponding selecting transistors by selectively applying the first and the second control signals to selecting lines A1, A2, B1, and B2. In this condition, only two control signals are required to control block 300 of the flat-cell ROM array according to the embodiment of the present invention.

Figure 9A:
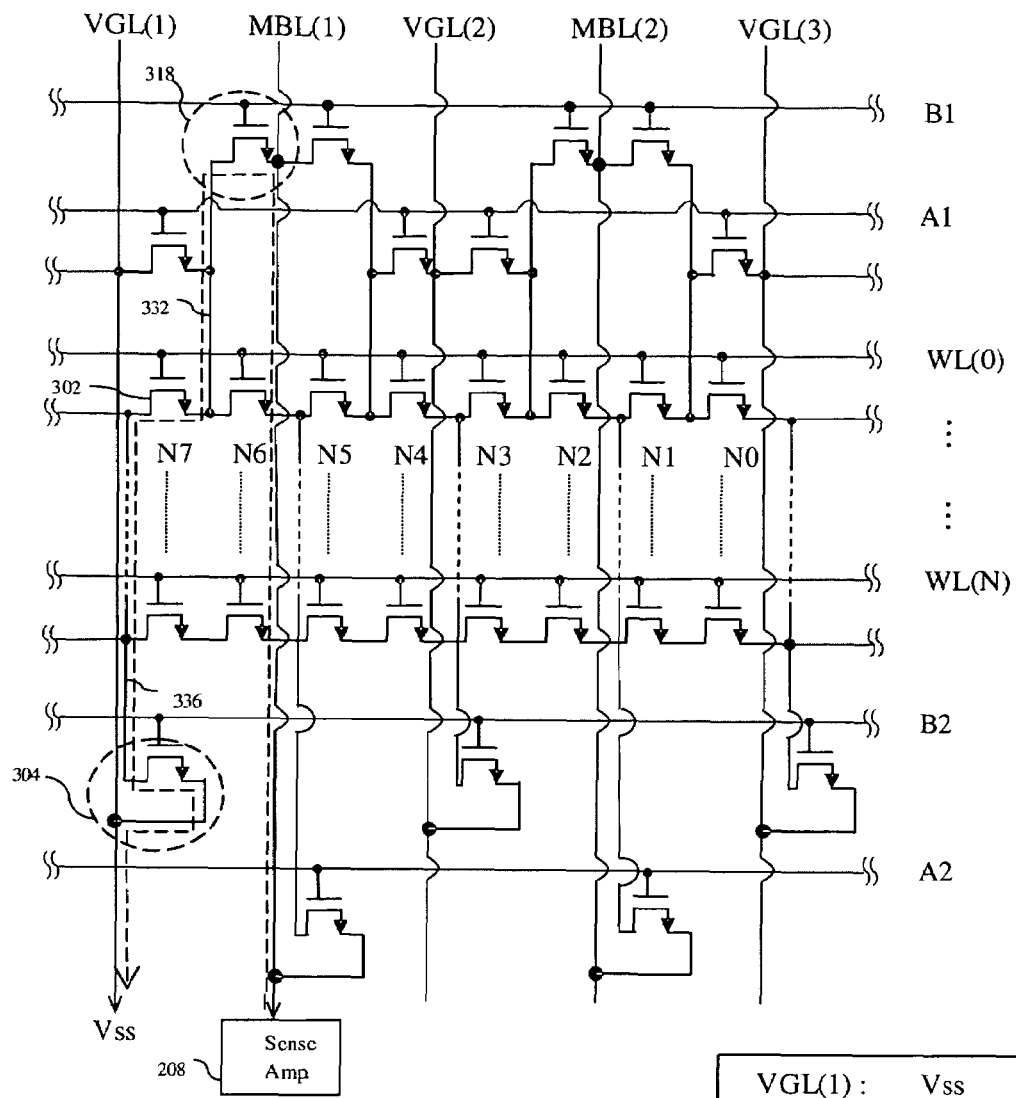
FIGS. 9A, 9B, 9C, and 9D are diagrams illustrating operation of the block of the flat-cell ROM array of FIG. 8.

FIGS. 9A, 9B, 9C, and 9D are diagrams illustrating the operation of block 300 of the flat-cell ROM array of FIG. 8. With reference to FIG. 9A, to access cell N7, for example, bit line VGL(1) is coupled to virtual ground voltage Vss and bit line MBL(1) is coupled to sense amplifier 208. Bit line VGL(2) adjacent to bit line MBL(1) is coupled to a reference voltage VBL (not shown), which is at substantially the same voltage level as sense amplifier 208, while the remaining bit lines are left floating. The voltages of selecting lines A1 and A2 are pulled low and the voltages of selecting lines B1 and B2 are pulled high by applying the second control signals. In this manner, the data stored within the cell N7 can be read out by means of a current that flows from sense amplifier 208 through bit line MBL(1), second selecting transistor 318, common signal line 332, transistor 302 of cell N7, signal line 336, fourth selecting transistor 304, and bit line VGL(1) to virtual ground voltage Vss, which is indicated in FIG. 9A. In this condition, the number of selecting transistors in the accessing path is two, i.e., second selecting transistor 318 and fourth selecting transistor 304.

Figure 9B:
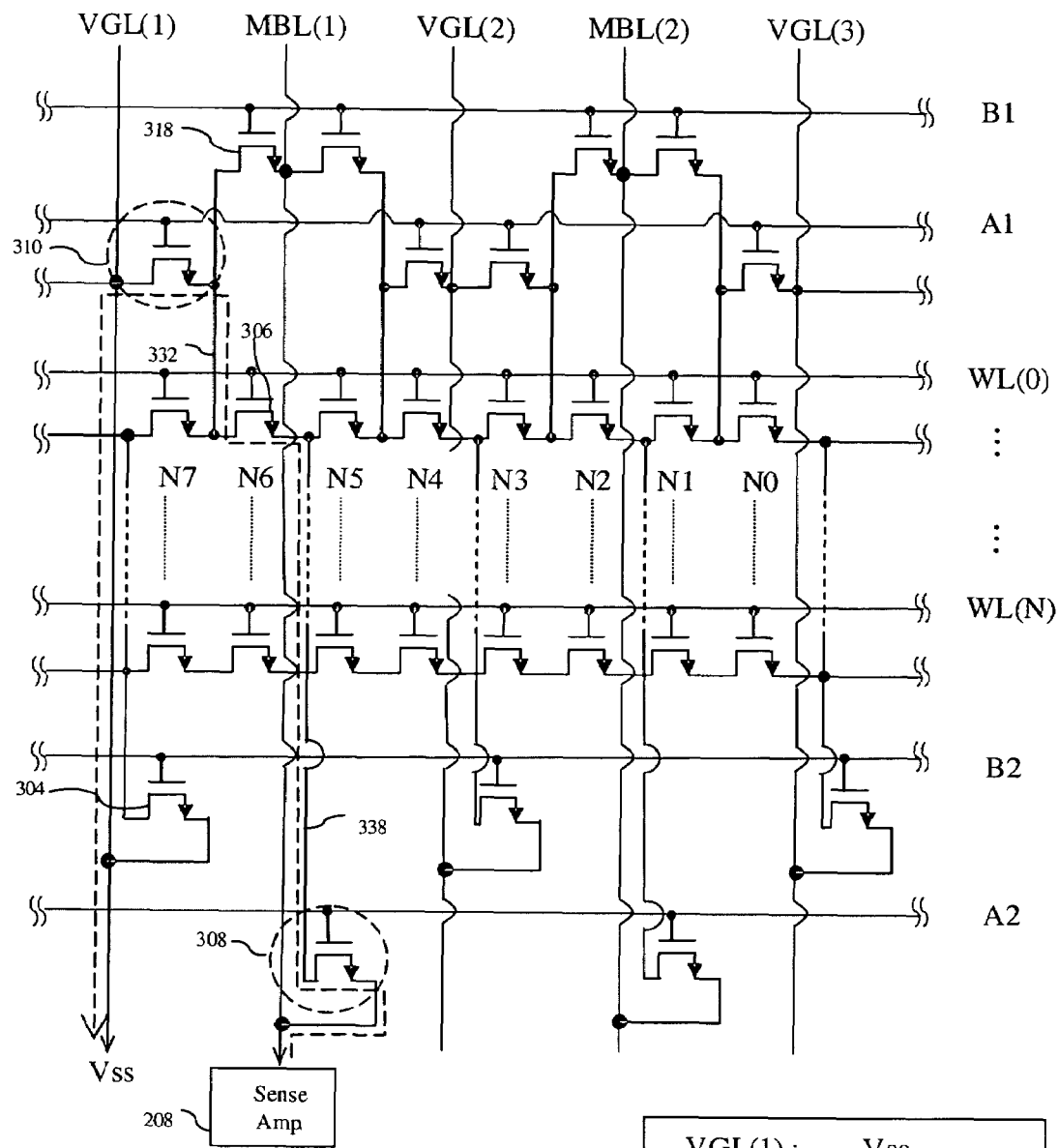

With reference to FIG. 9B, to access cell N6, bit line VGL(1) is coupled to virtual ground voltage Vss and bit line MBL(1) is coupled to sense amplifier 208. Bit line VGL(2) adjacent to bit line MBL(1) is coupled to a reference voltage VBL (not shown), which is at substantially the same voltage level as sense amplifier 208, while the remaining bit lines are kept floating. The voltages of selecting lines A1 and A2 are pulled high by applying the first control signals and the voltages of selecting lines B1 and B2 are pulled low. In this manner, the data stored within the cell N6 can be read out by means of a current that flows from sense amplifier 208 through bit line MBL(1), third selecting transistor 308, signal line 338, transistor 306 of cell N6, common signal line 332, first selecting transistor 310, and bit line VGL(1) to virtual ground voltage Vss. In this condition, the number of selecting transistors in the accessing path is two, i.e., first selecting transistor 310 and third selecting transistor 308.

Figure 9C:
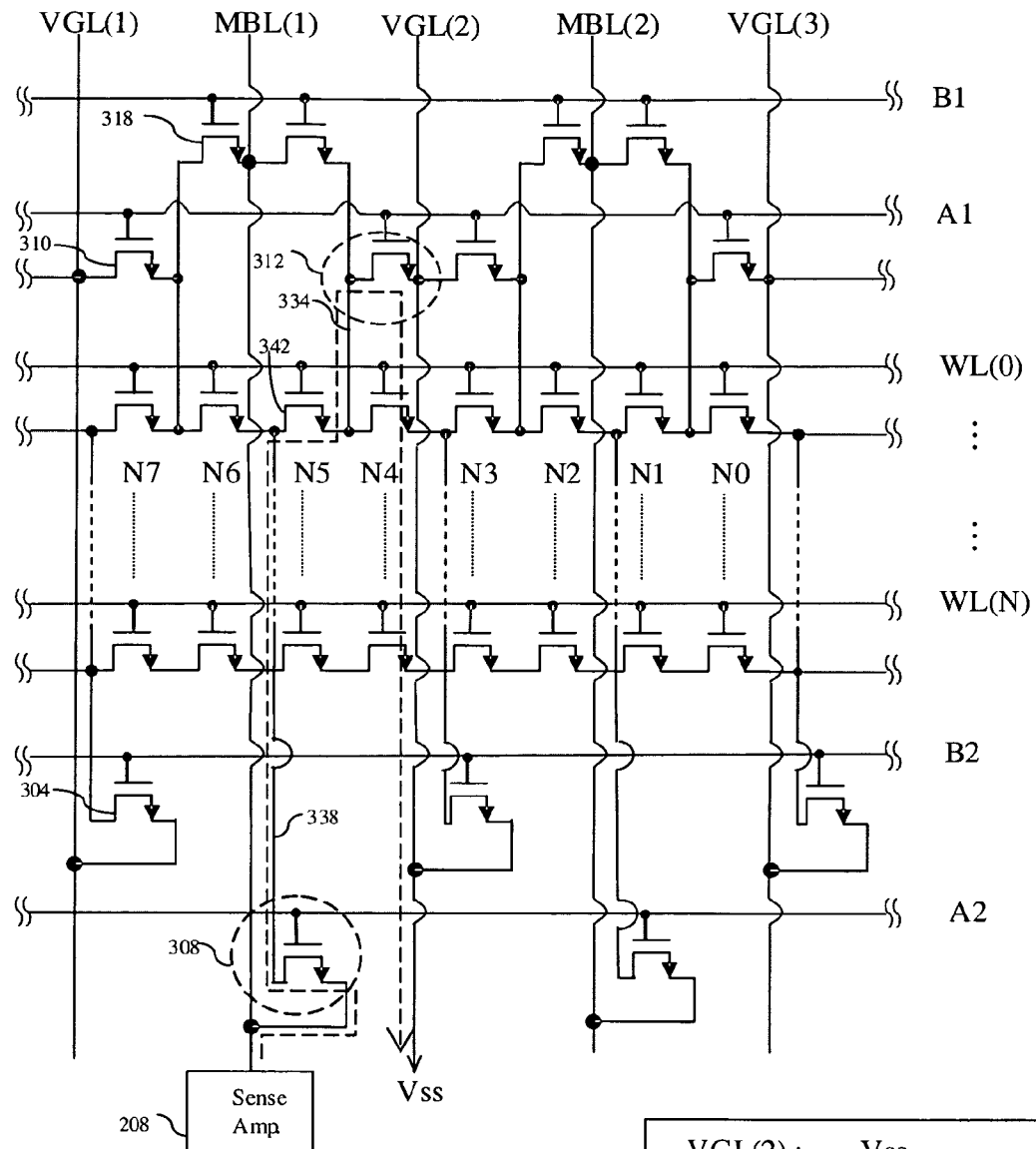

An operation to access cell N5 is similar to the operation for accessing cell N6. With reference to FIG. 9C, to access cell N5, bit line VGL(2) is coupled to virtual ground voltage Vss and bit line MBL(1) is coupled to sense amplifier 208. Bit line VGL(1) adjacent to bit line MBL(1) is coupled to a reference voltage VBL (not shown), which is at substantially the same voltage level as sense amplifier 208, while the remaining bit lines are kept floating. The voltages of selecting lines A1 and A2 are pulled high by applying the first control signals and the voltages of selecting lines B1 and B2 are pulled low, which is the same as for accessing cell N6. In this manner, the data stored within the cell N5 can be read out by means of a current that flows from sense amplifier 208 through bit line MBL(1), third selecting transistor 308, signal line 338, a transistor 342 of cell N5, common signal line 334, first selecting transistor 312, and bit line VGL(2) to virtual ground voltage Vss. In this condition, the number of selecting transistors in the accessing path is two, i.e., first selecting transistor 312 and third selecting transistor 308.

Figure 9D:
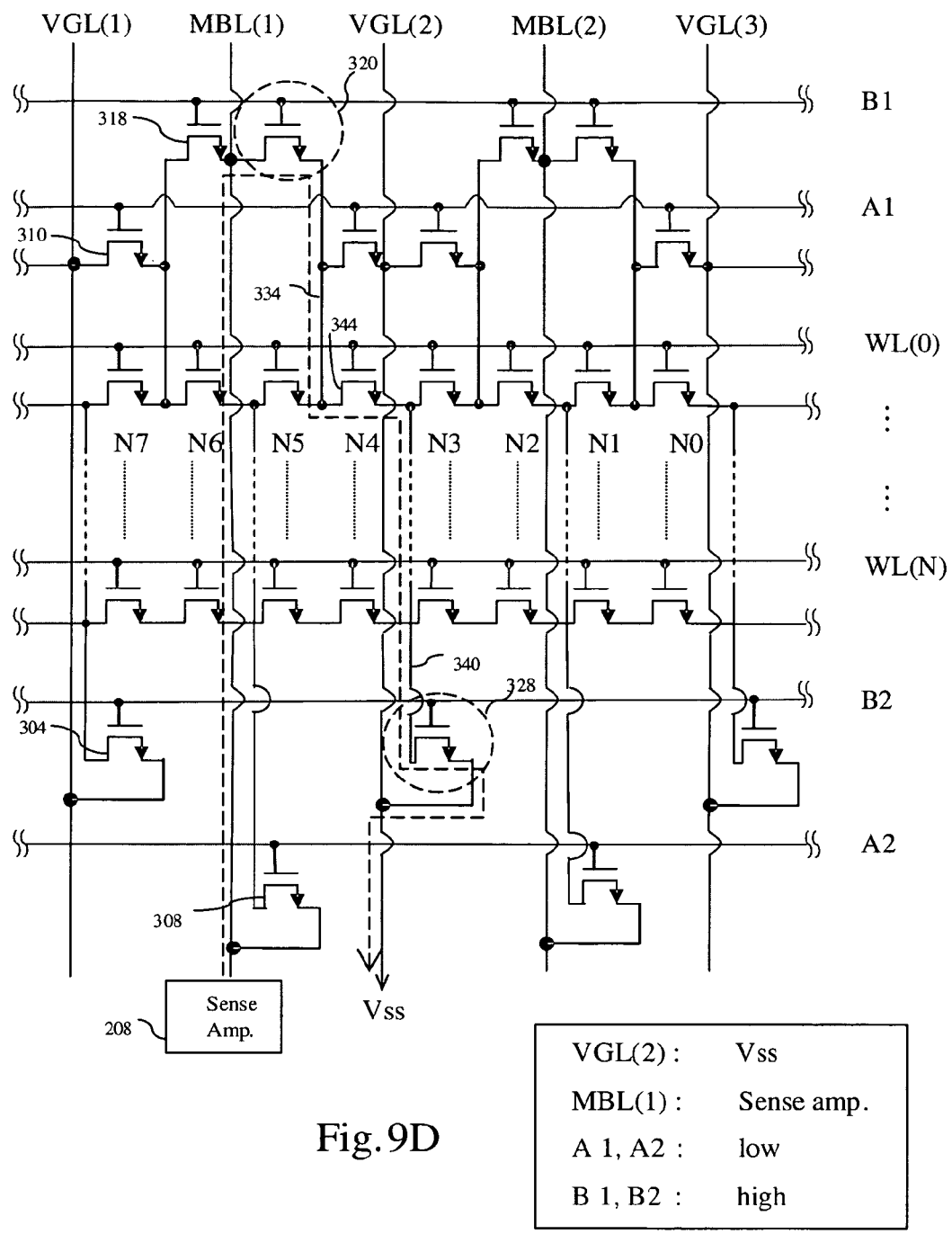

An operation to access cell N4 is similar to the operation for accessing cell N7. With reference to FIG. 9D, to access cell N4, bit line VGL(2) is coupled to virtual ground voltage Vss and bit line MBL(1) is coupled to sense amplifier 208. Bit line VGL(1) adjacent to bit line MBL(1) is coupled to a reference voltage VBL (not shown), which is at substantially the same voltage level as sense amplifier 208, while the remaining bit lines are kept floating. The voltages of selecting lines A1 and A2 are pulled low and the voltages of selecting lines B1 and B2 are pulled high by applying the second control signals, which is the same as for accessing cell N7. In this manner, the data stored within the cell N4 can be read out by means of a current that flows from the sense amplifier through bit line MBL(1), second selecting transistor 320, common signal line 334, a transistor 344 of cell N4, signal line 340, fourth selecting transistor 328, and bit line VGL(2) to virtual ground voltage Vss. In this condition, the number of selecting transistors in the accessing path is two, i.e., second selecting transistor 320 and fourth selecting transistor 328.

Four accessing paths are indicated in FIG. 9A~9D, respectively, through which current flows from sense amplifier 208 to virtual ground voltage Vss. In this embodiment, when different cells are read, the length of the accessing paths corresponding to the cells is the same. Since the length of the accessing path determines the resistance of the accessing path and the parasitic capacitance of bit lines is fixed, the time required to access each cell of the flat-cell ROM array is substantially the same regardless of the location of the cell in the flat-cell ROM array.

Figure 10:
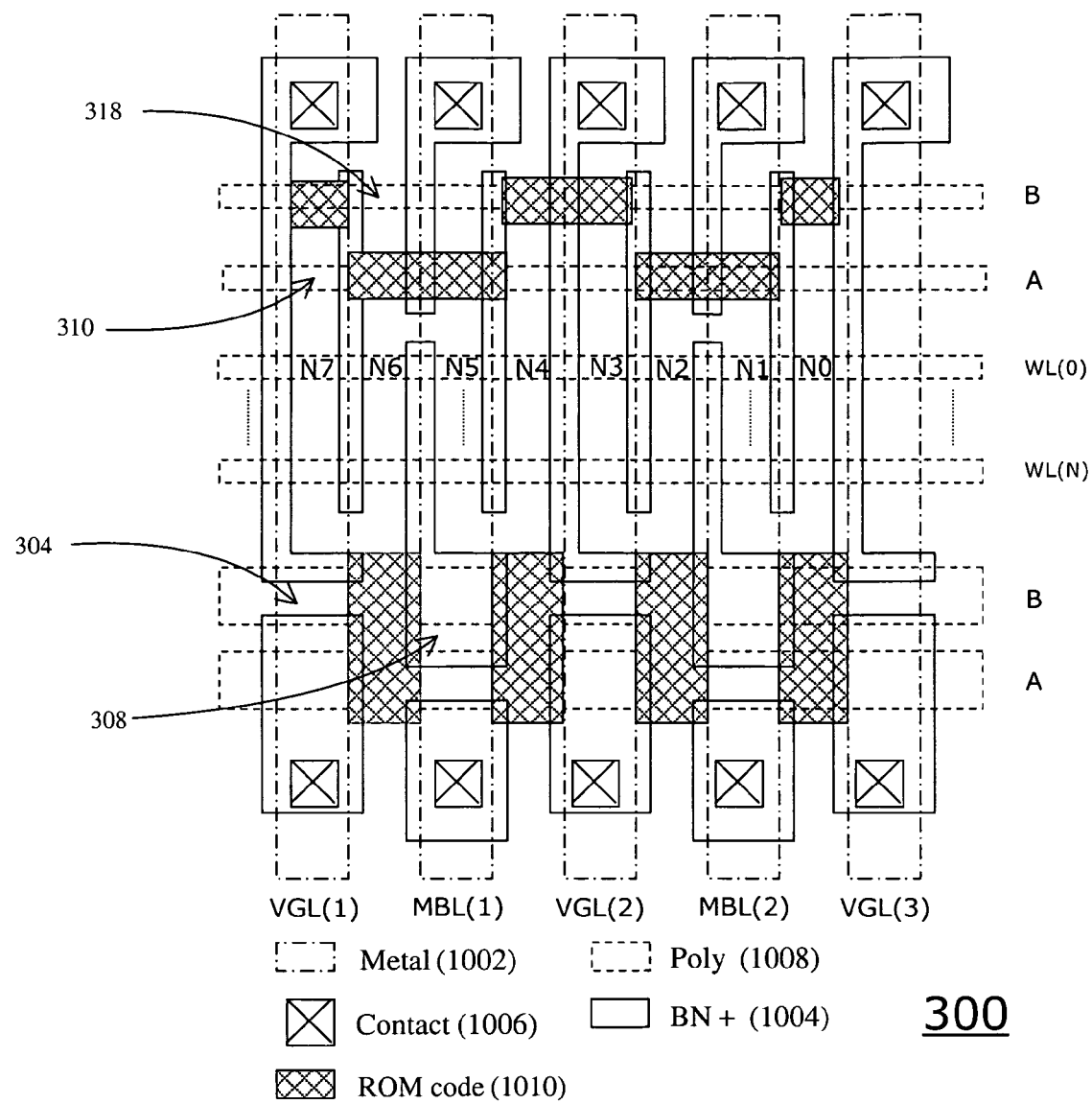
FIG. 10 is a diagram illustrating a layout of the flat-cell ROM structure of FIG. 8.

FIG. 10 is a diagram illustrating a layout of block 300 of the flat-cell ROM structure of FIG. 8. All VGLs and MBLs are included in the same metal layer 1002 and are connected to buried N+ (designated BN+ in FIG.10) layers 1004 through contacts 1006. Word lines WL(0)~WL(N) and control lines A1, A2, B1, and B2 are formed in areas A and B and included in a polysilicon layer 1008. Cells N0~N7 and selecting transistors 304, 308, 310, and 318 of FIG. 8 are illustrated in FIG. 10. ROM code layers 1010 are employed to control the formation of selecting transistors between polysilicon layer 1008 and BN+ layers 1004.

Figure 11:
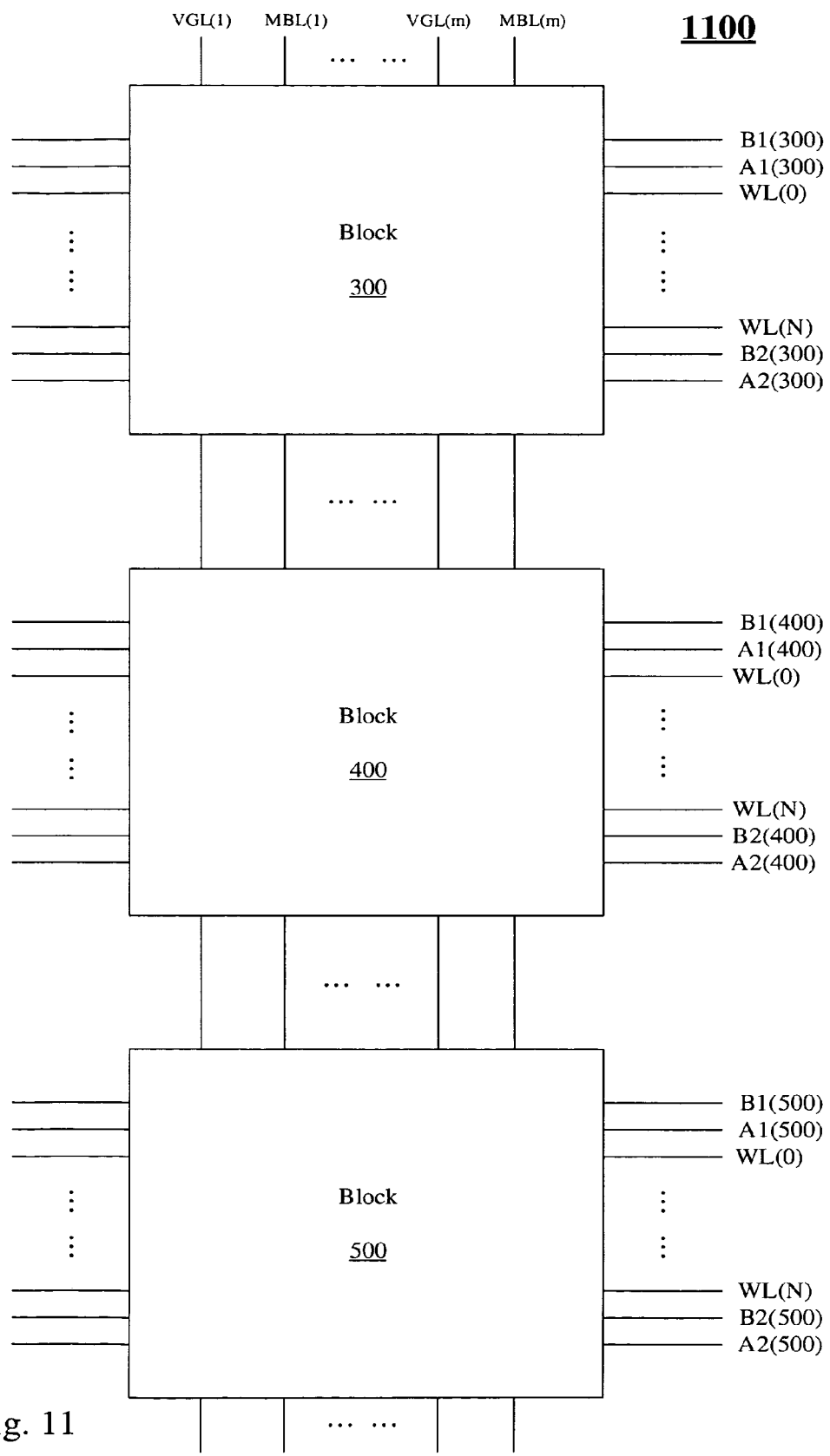
FIG. 11 is a diagram illustrating three blocks within the flat-cell ROM array of FIG. 8.

FIG. 11 is a diagram illustrating block 300 of memory cells as well as a block 400 and a block 500 of memory cells within a flat-cell ROM array 1100 according to an embodiment of the present invention. With reference to FIG. 11, all bit lines VGL(i) and MBL(i) are shared by blocks 300, 400, 500, and other blocks within the flat-cell ROM array. Each Block 300, 400, and 500 has four selecting lines controlled by two control signals. For example, block 300 has four selecting lines A1(300), A2(300), B1(300), and B2(300). Selecting lines A1(300) and A2(300) are controlled by the same control signal, i.e., the first control signal, and selecting lines B1(300) and B2(300) are controlled by the same control signal, i.e., the second control signal. In this condition, only two control signals are needed to control the operation of flat-cell ROM array 1100. These two control signals are generated as the first control signals for selecting lines A1 and A2 of one of the blocks of the flat-cell ROM array, and/or the second control signals to selecting lines B1 and B2 of one of the blocks of the flat-cell ROM array, all blocks within the flat-cell ROM array can be selected. For example, if block 300 is to be selected, the first control signals will only be applied to selecting lines A1(300) and A2(300) of block 300, and the second control signals will only be applied to selecting lines B1(300) and B2(300) of block 300. The other selecting lines will remain low. In this condition, only block 300 will be active. If block 400 is to be selected, the first control signals will only be applied to selecting lines A1(400) and A2(400) of block 400, and the second control signals will only be applied to selecting lines B1(400) and B2(400) of block 400. The other selecting lines will remain low. In this condition, only block 400 will be active. Therefore, block selecting lines and block selecting signals to enable block selecting lines are not required to operate the flat-cell ROM array of this embodiment. The number of control signals required to control the operation of the flat-cell ROM array can thereby be reduced to be smaller than that of other arrays known in the art. The area required for a circuit to generate and provide control signals and the overall size of the flat-cell ROM structure can also be reduced.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. An integrated circuit memory, comprising:
   a memory array including a plurality of memory cells in rows and columns, the memory array being divided into a plurality of blocks of the memory cells;
   wherein each of the blocks includes:
      a plurality of word lines arranged along the rows and coupled to the memory cells;
      a plurality of first and second bit lines individually and alternately allocated along every other column, each of the first bit lines for coupling to a virtual ground voltage and each of the second bit lines for coupling to a sense amplifier;
      a first selecting line and a second selecting line for providing a first control signal;
      a third selecting line and a fourth selecting line for providing a second control signal;
      a plurality of first selecting transistors having their gates coupled to the first selecting line to receive the first control signal and operable between ON and OFF states in response to the received first control signal, each of the first selecting transistors for coupling one of the memory cells in a selected row to one of the first bit lines in response to the first control signal, wherein two of the first selecting transistors are coupled to a same one of the first bit lines, that is coupled to the virtual ground voltage, and located on opposite sides of the one of the first bit lines;
      a plurality of second selecting transistors having their gates coupled to the third selecting line to receive the second control signal and operable between ON and OFF states in response to the received second control signal, each of the second selecting transistors for coupling one of the memory cells in the selected row to one of the second bit lines in response to the second control signal, wherein two of the second selecting transistors are coupled to a same one of the second bit lines, that is coupled to the sense amplifier, and located on opposite sides of the one of the second bit lines;
      a plurality of third selecting transistors having their gates coupled to the second selecting line to receive the first control signal, each of the third selecting transistors coupled to one of the second bit lines, each of the third selecting transistors for coupling one of the memory cells in the selected row to one of the second bit lines, that is coupled to the sense amplifier, in response to the first control signal; and
      a plurality of fourth selecting transistors having their gates coupled to the fourth selecting line to receive the second control signal, each of the fourth selecting transistors coupled to one of the first bit lines, each of the fourth selecting transistors for coupling one of the memory cells in the selected row to one of the first bit lines, that is coupled to the virtual ground voltage, in response to the second control signal;
   wherein when reading out data stored in all of the memory cells within the same block, respective lengths of read current flow paths corresponding to all of the memory cells within the same block are substantially the same.

2. The integrated circuit memory of claim 1, wherein the integrated circuit memory is a read-only memory (ROM) and said memory cells are flat ROM cells.

3. A method for reading out data from a flat-cell read-only memory comprising a memory array including a plurality of memory cells in rows and columns, the memory array being divided into a plurality of blocks of the memory cells, wherein each block includes:
   a plurality of word lines arranged along the rows and coupled to the memory cells;
   a plurality of first and second bit lines individually and alternately allocated along every other column, each of the first bit lines for coupling to a virtual ground voltage, each of the second bit lines for coupling to a sense amplifier;
   a first selecting line for providing a first control signal;
   a second selecting line for providing the first control signal;
   a third selecting line for providing a second control signal;
   a fourth selecting line for providing the second control signal;
   a plurality of first selecting transistors having their gates coupled to the first selecting line to receive the first control signal and operable between ON and OFF states in response to the received first control signal, each of the first selecting transistors for coupling one of the memory cells in a selected row to one of the first bit lines in response to the first control signal, wherein two of the first selecting transistors are coupled to a same one of the first bit lines and located on opposite sides of the one of the first bit lines;
   a plurality of second selecting transistors having their gates coupled to the third selecting line to receive the second control signal and operable between ON and OFF states in response to the received second control signal, each of the second selecting transistors for coupling one of the memory cells in the selected row to one of the second bit lines in response to the second control signal, wherein two of the second selecting transistors are coupled to a same one of the second bit lines and located on opposite sides of the one of the second bit lines;
   a plurality of third selecting transistors having their gates coupled to the second selecting line to receive the first control signal, each of the third selecting transistors coupled to one of the second bit lines, each of the third selecting transistors for coupling one of the memory cells in the selected row to one of the second bit lines in response to the first control signal; and a plurality of fourth selecting transistors having their gates coupled to the fourth selecting line to receive the second control signal, each of the fourth selecting transistors coupled to one of the first bit lines, each of the fourth selecting transistors for coupling one of the memory cells in the selected row to one of the first bit lines in response to the second control signal;

the method comprising:

enabling one of the word lines;

coupling one of the first bit lines to the virtual ground voltage;

coupling one of the second bit lines to the sense amplifier; and applying:

either the first control signal to the first and the second selecting lines to turn ON the first and the third selecting transistors, respectively, or the second control signal to the third and the fourth selecting lines to turn ON the second and the fourth selecting transistors, respectively;

wherein by applying either the first or the second control signal, one of the memory cells coupled to the enabled word line of one of the blocks is selected to:

be coupled to one of the second bit lines coupled to the sense amplifier by one of the second and the third selecting transistors and be coupled to one of the first bit lines coupled to the virtual ground voltage by one of the first and the fourth selecting transistors.

4. The method of claim 3, wherein the one of the first bit lines coupled to the virtual ground voltage is adjacent to the one of the second bit lines coupled to the sense amplifier.

5. The method of claim 3, further including reading data out of a selected memory cell, by applying the first control signal to the first and second selecting lines, by means of a read current that flows along a path from:

the sense amplifier, the second bit line coupled to the sense amplifier, the third selecting transistor coupling the selected memory to the second bit line, the selected memory cell, the first selecting transistor coupling the selected memory to the first bit line, the first bit line coupled to the virtual ground voltage, and the virtual ground voltage, wherein reading data stored in each of the memory cells within the same block comprises causing read current to flow along read current flow paths having respective lengths that are substantially the same.

6. The method of claim 3, further including reading data out of a selected memory cell, by applying the second control signal to the third and fourth selecting lines, by means of a read current that flows along a path from:

the sense amplifier, the second bit line coupled to the sense amplifier, the second selecting transistor coupling the selected memory cell to the second bit line, the selected memory cell, the fourth selecting transistor coupling the selected memory cell to the first bit line, the first bit line coupled to the virtual ground voltage, and the virtual ground voltage, wherein reading data stored in each of the memory cells within the same block comprises causing read current to flow along read current flow paths having respective lengths that are substantially the same.

7. The integrated circuit memory of claim 1, wherein one of the first bit lines coupled to the virtual ground voltage is adjacent to one of the second bit lines coupled to the sense amplifier.

* * * * *